(12) United States Patent
Takeuchi

(10) Patent No.: US 8,223,550 B2
(45) Date of Patent: Jul. 17, 2012

(54) NONVOLATILE SEMICONDUCTOR MEMORY APPARATUS COMPRISING CHARGE ACCUMULATION LAYER AND CONTROL GATE

(75) Inventor: Yoshiaki Takeuchi, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 262 days.

(21) Appl. No.: 12/760,866

(22) Filed: Apr. 15, 2010

(65) Prior Publication Data

US 2010/0271882 A1 Oct. 28, 2010

(30) Foreign Application Priority Data

Apr. 27, 2009 (JP) ................................. 2009-107929

(51) Int. Cl.
*G11C 16/00* (2006.01)
*G11C 7/00* (2006.01)
(52) U.S. Cl. ......... 365/185.18; 365/185.17; 365/189.05; 365/189.17
(58) Field of Classification Search ............... 365/189.17
See application file for complete search history.

(56) References Cited

U.S. PATENT DOCUMENTS

| | | | |
|---|---|---|---|
| 5,625,590 A * | 4/1997 | Choi et al. ............... | 365/185.17 |
| 6,337,832 B1 | 1/2002 | Ooishi et al. | |
| 2008/0259685 A1 | 10/2008 | Makino | |

FOREIGN PATENT DOCUMENTS

JP 2008-90978 4/2008

OTHER PUBLICATIONS

Office Action issued May 9, 2011, in Korean Patent Application No. 10-2010-0023732.
Dean Nobunaga, et al., "A 50nm 8Gb NAND Flash Memory with 100MB/s Program Throughput and 200MB/s DDR Interface", IEEE ISSCC, Feb. 3-7, 2008, pp. 1-3.

* cited by examiner

*Primary Examiner* — Tan T. Nguyen
(74) *Attorney, Agent, or Firm* — Oblon, Spivak, McClelland, Maier & Neustadt, L.L.P.

(57) ABSTRACT

A nonvolatile semiconductor memory apparatus includes memory cell strings, first and second bit lines, a first buffer, a second buffer, and a controlling unit. The memory cell strings each include memory cells. The first and second bit lines connected to the memory cell strings. The first buffer connects to the first bit line and holds first data. The second buffer connects to the second bit line and holds second data. The controlling unit includes first and second latches and controls timing to output the first and second data according to an internal terminal, a second signal, and a third signal, and transfers a control signal synchronized with the timing of the first and second data to the external terminal. The controlling unit allows the first latch to hold the first and second data, and transfers the first data, and thereafter transfers the second data.

20 Claims, 9 Drawing Sheets

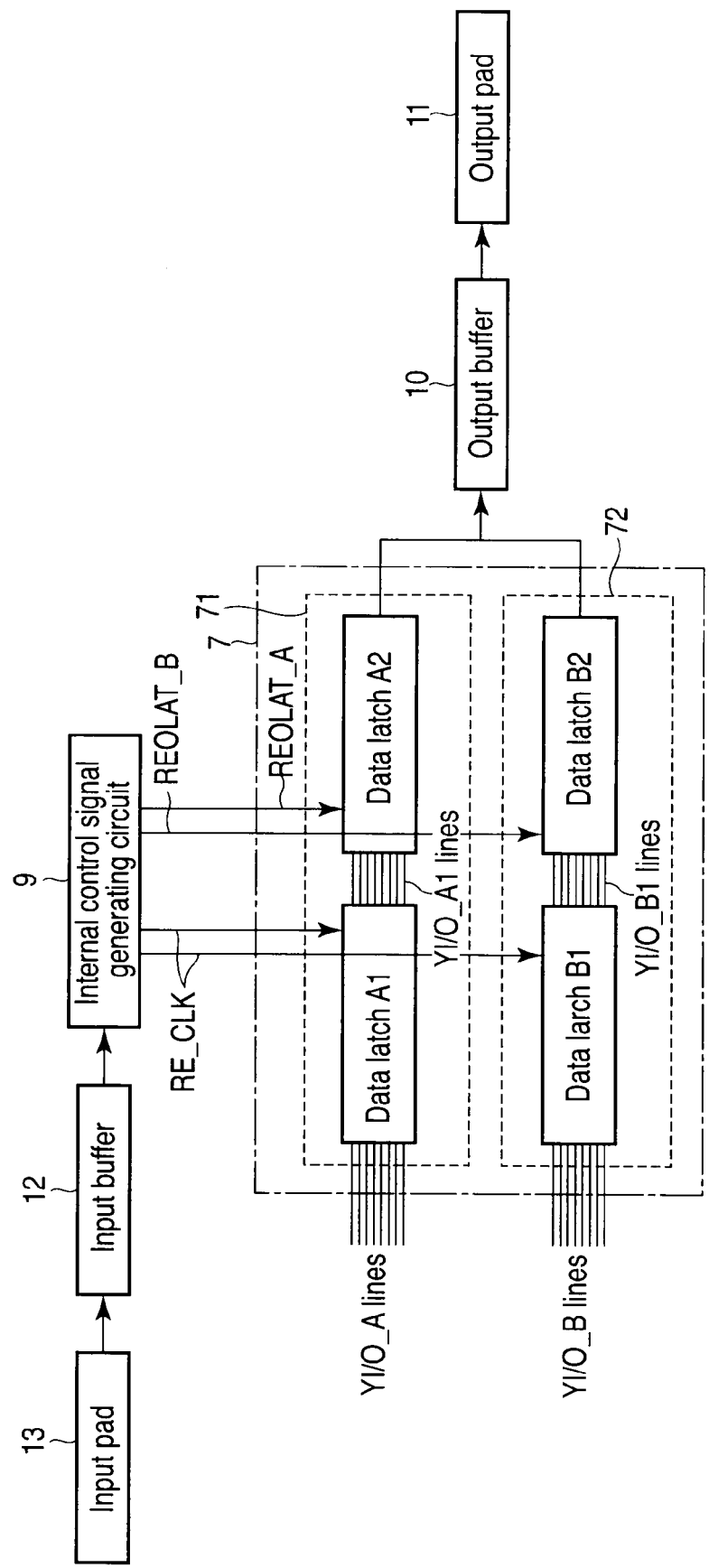
F I G. 3

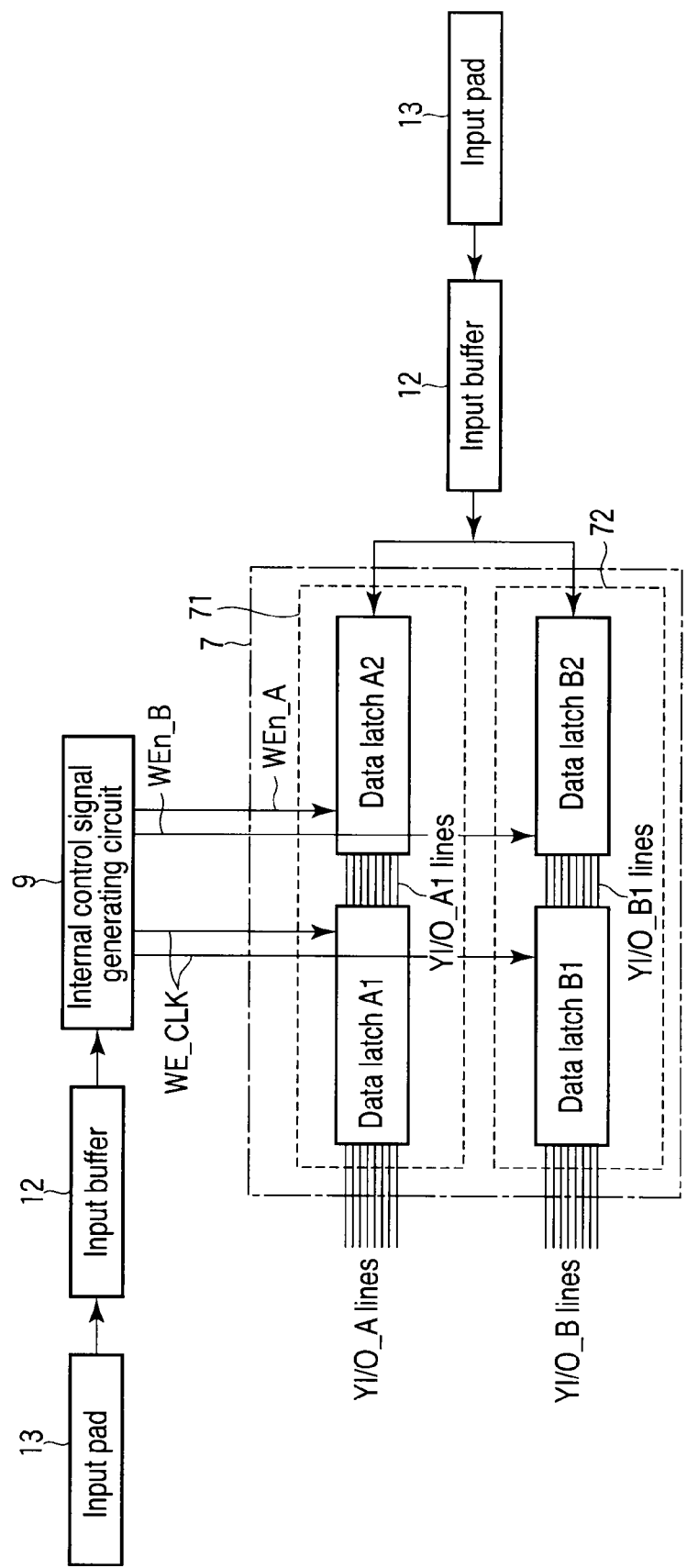
F I G. 4

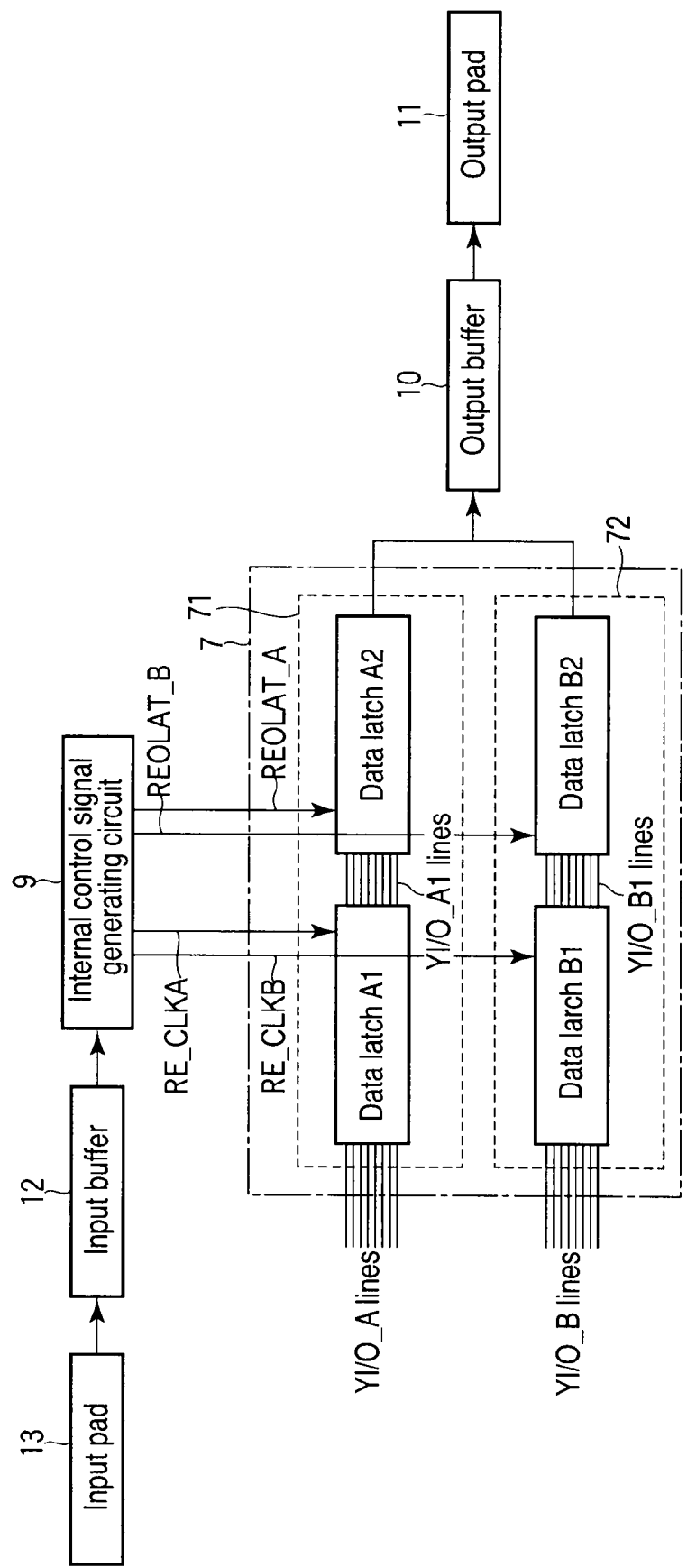
F I G. 7

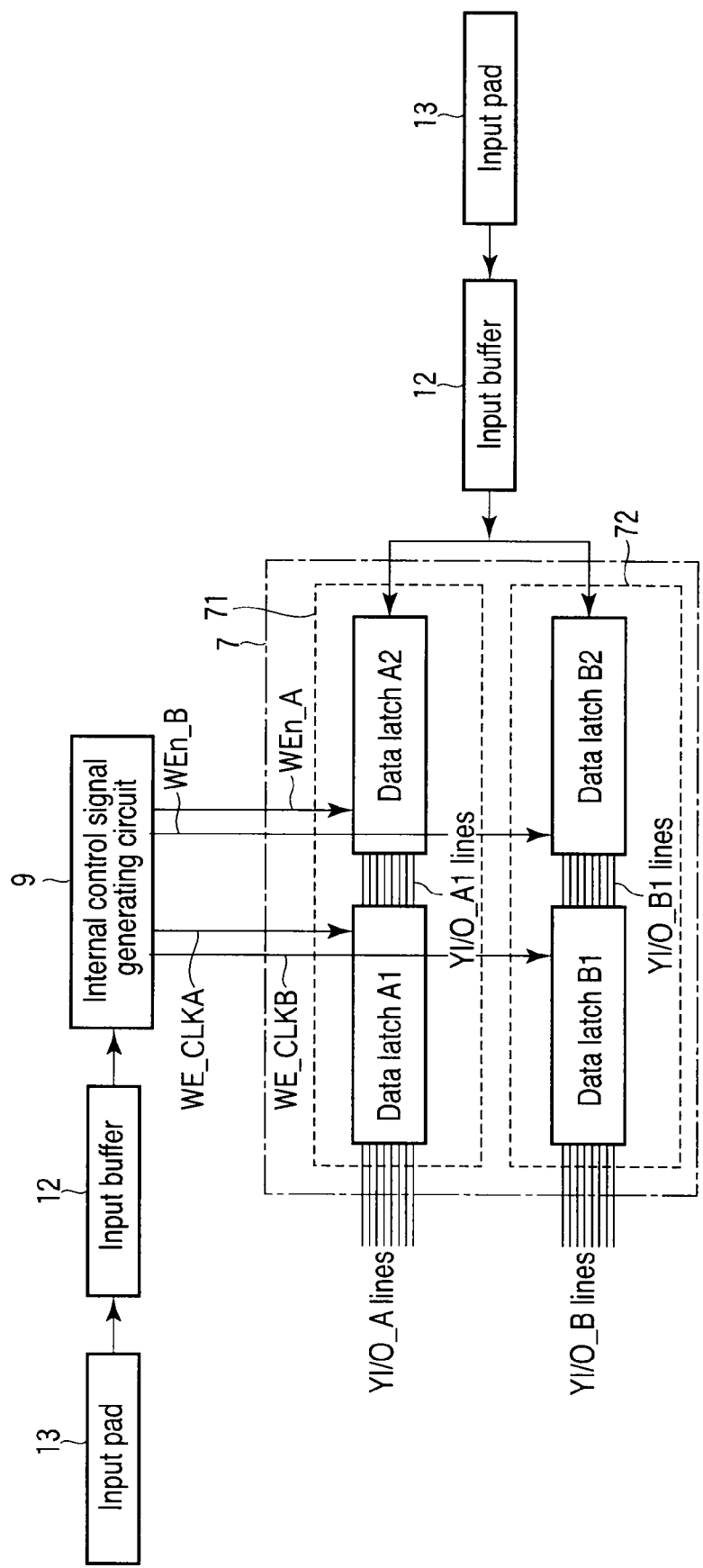
F I G. 8

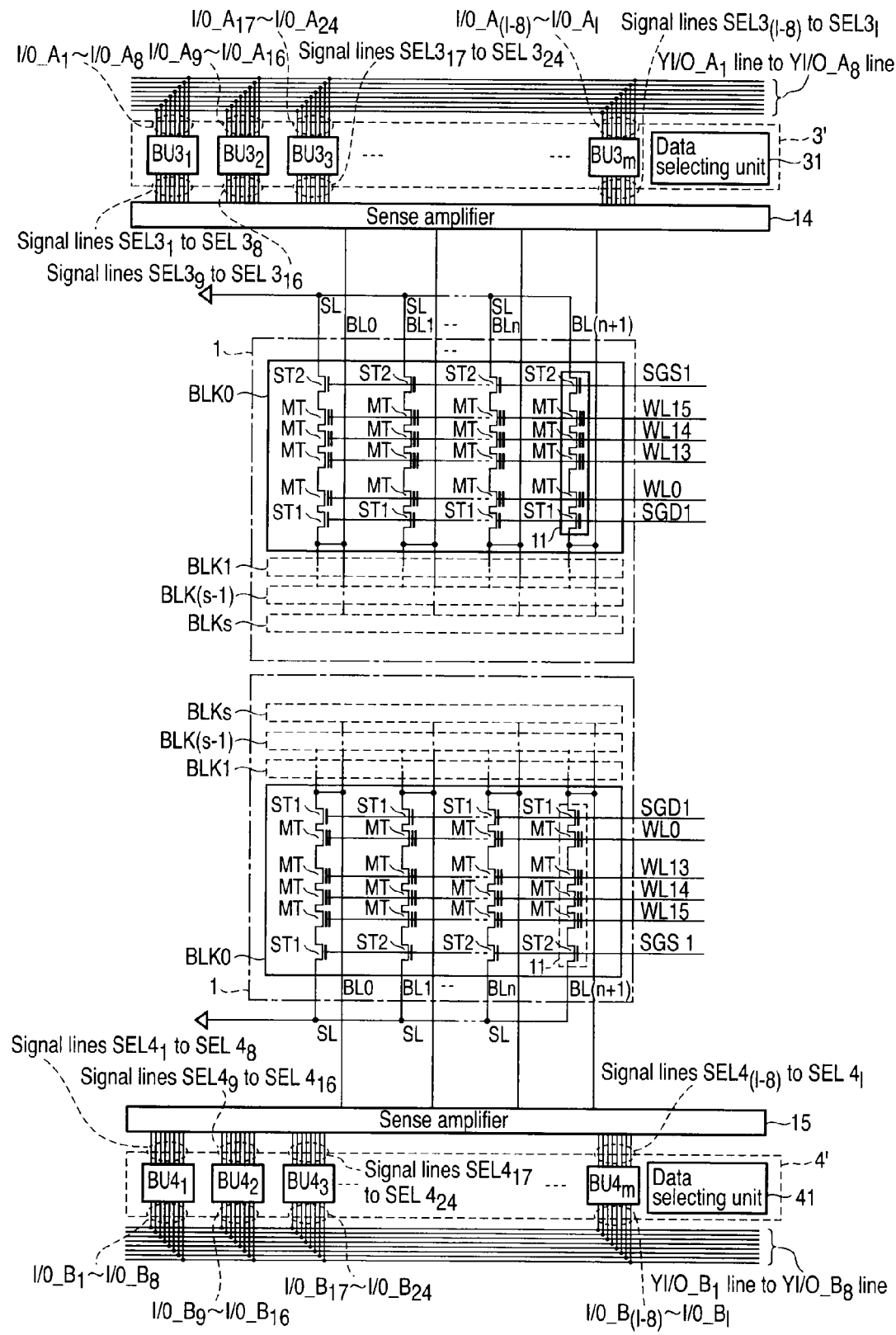
F I G. 11

US 8,223,550 B2

NONVOLATILE SEMICONDUCTOR MEMORY APPARATUS COMPRISING CHARGE ACCUMULATION LAYER AND CONTROL GATE

CROSS-REFERENCE TO RELATED APPLICATIONS

This application is based upon and claims the benefit of priority from prior Japanese Patent Application No. 2009-107929, filed Apr. 27, 2009, the entire contents of which are incorporated herein by reference.

BACKGROUND OF THE INVENTION

1. Field of the Invention

The invention relates to a nonvolatile semiconductor memory apparatus.

2. Description of the Related Art

Jap. Pat. Appln. KOKAI Publication No. 2008-90978 discloses that 8-bit data, for example, read from a memory cell is output to an external terminal in synchronization with the rising of a clock signal generated by a control circuit.

BRIEF SUMMARY OF THE INVENTION

A nonvolatile semiconductor memory apparatus according to an aspect of the invention includes:

memory cell strings each including a plurality of memory cells including a charge accumulation layer and a control gate of which current pathways are connected in series;

first and second bit lines each connected to the current pathway of one of the memory cells in one end side of the series connection;

a first buffer connected to the first bit line and capable of holding first data of a first bit number;

a second buffer connected to the second bit line and capable of holding second data of the first bit number; and a data transfer controlling unit including first and second latches and controlling timing to output the first and second data held in the first and second buffers to an external terminal according to an internal signal generated based on a first external signal, a second internal signal generated at rising of the first external signal and a third internal signal generated at falling of the first external signal, and the data transfer controlling unit transferring a control signal synchronized with the timing of the first and second data to the external terminal, the data transfer controlling unit allowing the first latch to hold the first and second data held in the first and second buffers respectively, in synchronization with the first internal signal, and transferring the first data held in the first latch in synchronization with the second internal signal to the external terminal through the second latch, and thereafter transferring the second data to the external terminal through the second latch in synchronization with the third internal signal.

BRIEF DESCRIPTION OF THE SEVERAL VIEWS OF THE DRAWING

FIGS. 3 and 4 are block diagrams of a data transfer control circuit and an internal control signal generating circuit when reading and writing data according to the first embodiment of the invention;

FIGS. 7 and 8 are block diagrams of the data transfer control circuit and the internal control signal generating circuit when reading and writing the data according to a second embodiment of the invention;

FIG. 11 is a block diagram of the memory cell array according to a first modified example of the embodiment of the invention.

DETAILED DESCRIPTION OF THE INVENTION

Figure 1:
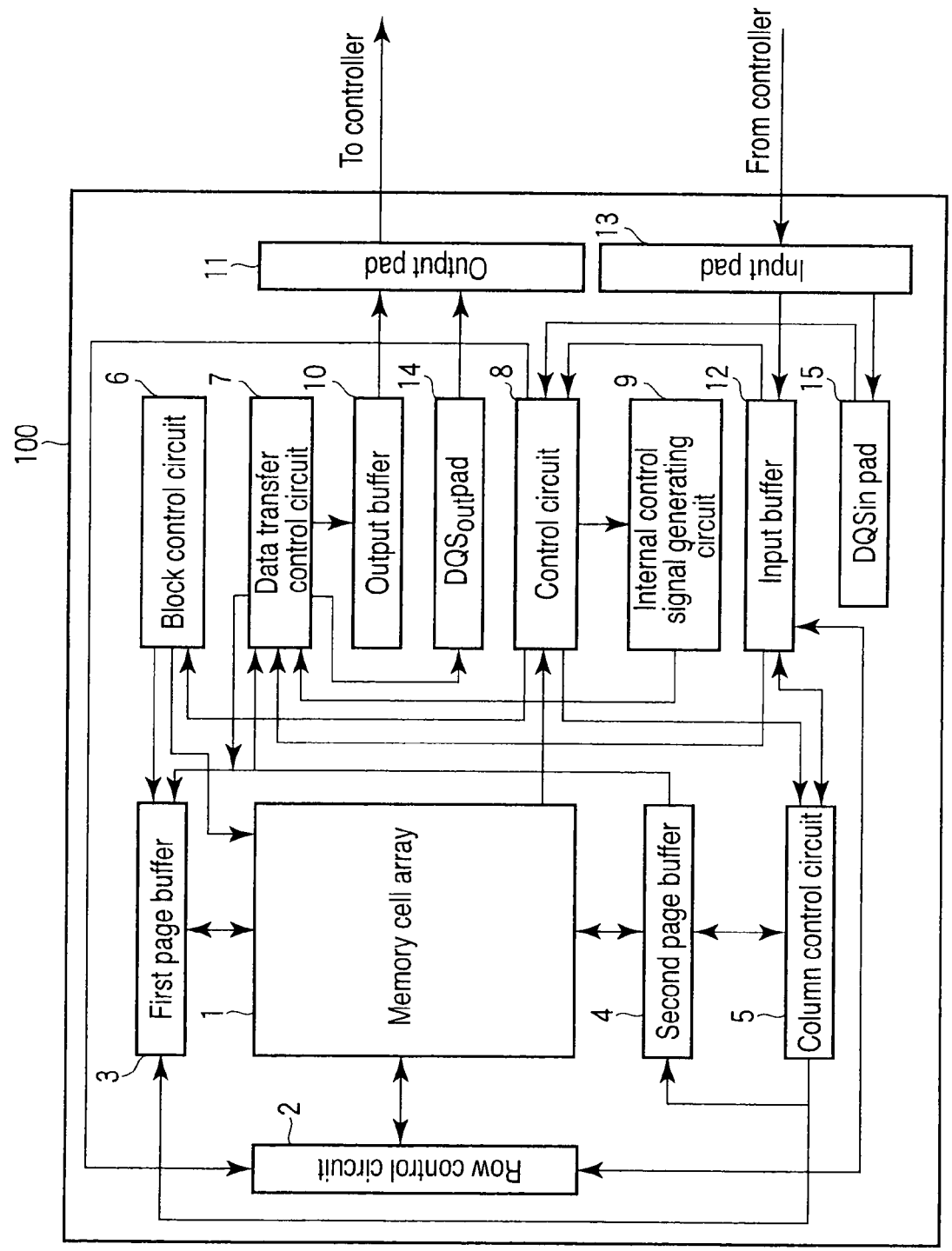
FIG. 1 is a block diagram of a NAND-type flash memory according to a first embodiment of the invention.

Hereinafter, embodiments of the invention are described with reference to the drawings. In the description, common reference numerals are assigned to common portions throughout the drawings.

First Embodiment

A nonvolatile semiconductor memory apparatus 100 according to a first embodiment of the invention is described with reference to FIG. 1. FIG. 1 illustrates a NAND-type flash memory, for example, as an example of a nonvolatile semiconductor memory apparatus 100 according to this embodiment. This embodiment applies a toggle mode (synchronization with falling and rising of clock signal, data input and output in a toggle manner, that is to say, data is alternately read by two buffers from one memory cell array of the NAND-type flash memory and the read data is alternately output, or write data supplied from a host is alternately distributed to the two buffers and the data is written into the memory cell array) to an input and an output of the nonvolatile semiconductor memory apparatus 100.

<Overall Configuration>

As illustrated, the nonvolatile semiconductor memory apparatus 100 comprises a memory cell array 1, a row control circuit 2, a first page buffer 3, a second page buffer 4, a column control circuit 5, a block control circuit 6, a data transfer control circuit 7, a control circuit 8, an internal control signal generating circuit 9, an output buffer 10, an output pad 11, an input buffer 12, an input pad 13, a data strobe pad$_{OUT}$ 14 (hereinafter, referred to as a data strobe pad$_{OUT}$ 14 or a DQS$_{OUT}$ 14), and a data strobe pad$_{IN}$ 15 (hereinafter, referred to as a data strobe pad$_{IN}$ 15 or a DQS$_{IN}$ 15). First, the memory cell array 1 is described.

The memory cell array 1 comprises a plurality of nonvolatile memory cell transistors MT capable of holding data. The memory cell transistor MT is an re-channel type MOS transistor comprising a stacked gate including a charge accumulation layer and a control gate, for example. The control gate of the memory cell transistor MT serves as a word line WL. A drain of the memory cell transistor MT is electrically connected to a bit line BL and a source thereof is electrically connected to a source line SL. The memory cell array 1 comprises a sense amplifier, to be described later, in addition to the above-described memory cell transistors MT.

The row control circuit 2 selects any one block BLK of the memory cell array 1 according to a block selection signal provided by the block control circuit 6. Then, the row control circuit 2 selects a row direction of the memory cell array 1 corresponding to the selected block BLK. That is to say, the row control circuit 2 applies a voltage supplied by a voltage generating circuit 4 to each of select gate lines SGD1 and SGS1 and word lines WL0 to WL15 according to the selection signal provided by the block control circuit 6.

The first page buffer 3 comprises a plurality of latches capable of holding the data transferred from an unillustrated host (this means a NAND controller in this embodiment, represented as a controller in the drawing) in 8-bit units, for example. The first page buffer 3 is capable of temporarily holding the data, in page units, read from the memory cell array 1, and transferring the data to an unillustrated host, through the output pad 11, as 8-bit unit data, for example.

The second page buffer 4 comprises a plurality of latches capable of holding the data transferred from an unillustrated host in 8-bit units, for example, as in the above-described first page buffer 3. Also, the second page buffer 4 is capable of temporarily holding the data in the page unit read from the memory cell array 1, and transfer to an unillustrated host through the output pad 11 as the 8-bit unit data, for example.

The column control circuit 5 selects a column direction of the memory cell array 1. That is to say, the column control circuit 5 selects the bit line BL.

The block control circuit 6 decodes a block address provided by the control circuit 8 at the time of writing, reading and deleting the data and selects the block BLK based on a decoded result.

The data transfer control circuit 7 synchronizes held data (hereinafter, also referred to as read data or simply data) held in the first page buffer 3 and the second page buffer 4 at the time of reading the data with a signal generated by the internal control signal generating circuit 9 to transfer to the output pad 11. At such time, the data transfer control circuit 7 alternately outputs each of the read data in 8-bit units, for example, transferred from the first and second buffers 3 and 4 to the output pad 11. Also, when writing the data, the data transfer control circuit 7 synchronizes the data in 8-bit units, for example (hereinafter, also referred to as write data or simply data), input from an unillustrated host, with the signal generated by the above-described internal control signal generating circuit 9 to alternately capture data. Thereafter, the data transfer control circuit 7 transfers the captured data to the first and second page buffers 3 and 4 in the 8-bit unit.

The data transfer control circuit 7 generates a signal obtained by duplicating the output of the above-described read data. That is to say, the duplicated signal is synchronized with the output of the read data. The data transfer control circuit 7 outputs the duplicated signal to the $DQS_{OUT}$ 14 to be described later. Hereinafter, the signal is referred to as a signal $D_{OUT}$.

The control circuit 8 controls the row control circuit 2, the column control circuit 5 and the block control circuit 6 according to a control signal supplied from an unillustrated host through the input pad 13, the input buffer 12 and the $DQS_{IN}$ 15. That is to say, when writing, reading and deleting data, the control circuit 8 gives the row control circuit 2, the column control circuit 5 and the block control circuit 4 an access right to the memory cell array 1. In this manner, the control circuit 8 controls the row control circuit 2, the column control circuit 5 and the block control circuit 4, thereby writing, reading and deleting the data of the memory cell in the memory cell array 1.

Especially, when reading and writing data, the control circuit 8 controls the data transfer control circuit 7. The control circuit 8 outputs the read data held in the data transfer control circuit 7 from the output pad 11 through the output buffer 10. Also, the control circuit 8 outputs the signal $D_{OUT}$ held in the data transfer control circuit 7 from the output pad 11 through the $DQS_{OUT}$ 14.

The control circuit 8 transfers the write data supplied from an unillustrated host through the input pad 13 and the input buffer 12 to the data transfer control circuit 7 to the first and second buffers 3 and 4. Further, the control circuit 8 transfers the control signal of a signal $D_{IN}$, for example, input from an unillustrated host through the input pad 13 and the $DQS_{IN}$ 15 to the internal control signal generating circuit 9 and the output buffer 10.

The internal control signal generating circuit 9 generates an internal control signal according to the control signal supplied from an unillustrated host through the input pad 13, the input buffer 12 and the $DQS_{IN}$ 15. The internal control signal is a signal to transfer the data to the output pad 11 or the first and second buffers 3 and 4 when executing the data input and output.

The output buffer 10 receives the data from the data transfer control circuit 7 and transfers the data to the output pad 11 in synchronization with the control signal supplied from an unillustrated host output by the above-described control circuit 8.

Then, the output pad 11 outputs the data supplied from the above-described output buffer 10 and the $DQS_{OUT}$ 14 to an unillustrated host.

The input buffer 12 temporarily holds the data and the control signal supplied from the input pad 13, described later. The input buffer 12 outputs the control signal to the control circuit 8 and outputs the data to the row control circuit 2 and the column control circuit 5.

The input pad 13 outputs the data (command, clock signal, address and the like) and the control signal supplied from an unillustrated host (represented as a controller in the drawing) to the input buffer 12 and the $DQS_{IN}$ 15.

Meanwhile, the input pad 13 and the output pad 11, which inputs and outputs the data supplied from an unillustrated host and the data read from the memory cell array 1, are commoditized in general. Meanwhile, the input buffer 12 comprises the respective buffers for the data and the control signal output by the input pad 13. That is to say, the data supplied from the input pad 13 is supplied to the row control circuit 2 and the column control circuit 5 through the buffer for the data provided in the input buffer 12. Also, the control signal supplied from the input pad 13 is supplied to the control circuit 7 through the buffer for the control signal provided in the input buffer 12.

The $DQS_{OUT}$ 14 outputs the signal $D_{OUT}$ supplied from the above-described data transfer control circuit 7 to an unillustrated host. As described above, the signal $D_{OUT}$ is a duplication of the data output to an unillustrated host by the above-described output pad 11. That is to say, when reading data, the signal $D_{OUT}$ synchronized with the read data output from the output pad 11 is output from the $DQS_{OUT}$ 14 to an unillustrated host. An unillustrated host monitors the signal $D_{OUT}$, thereby confirming the read data output from the output pad 11. That is to say, the unillustrated host monitors the signal $D_{OUT}$, and as a result, when the host cannot confirm the signal $D_{OUT}$, the host may judge that the read data is not output from the output pad 11. As a result of monitoring, when the unillustrated host confirms the output of the signal $D_{OUT}$, the host receives the read data in synchronization with the signal $D_{OUT}$. In other words, the signal $D_{OUT}$ serves as a control signal for the read data. The $DQS_{OUT}$ 14 may be provided within the output buffer 10.

The $DQS_{IN}$ 15 receives the control signal from the input pad 13. The control signal is a data transferred from the host. That is to say, this is the signal synchronized with the write data. The control signal is hereinafter referred to as the signal $D_{IN}$. The $DQS_{IN}$ 15 outputs the signal $D_{IN}$ to the control circuit 8. The signal $D_{IN}$ is the signal synchronized with a control signal /WE for writing, described later. That is to say, the data is written according to the signal $D_{IN}$ or the control signal /WE. Hereinafter, the control signal /WE is also referred to as the signal $D_{IN}$ and the signal $D_{IN}$ is also referred to as the control signal /WE. The $DQS_{IN}$ 15 may be provided in the input buffer 12.

<Details of Memory Cell Array 1 and First and Second Page Buffers 3 and 4>

Figure 2:
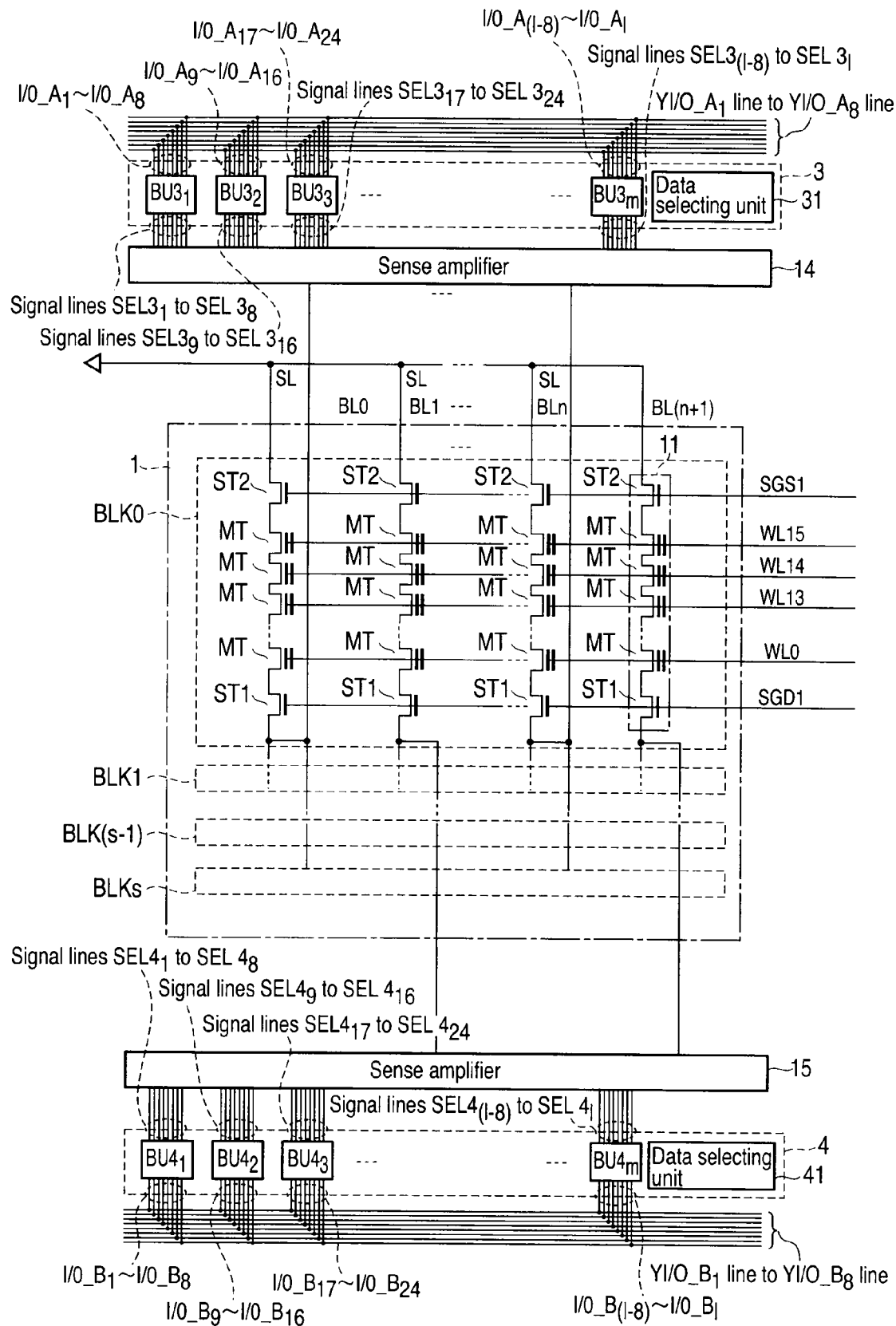
FIG. 2 is a block diagram of a memory cell array, a sense amplifier and a page buffer according to the first embodiment of the invention.

Next, the above-described memory cell array 1 and first and second page buffers 3 and 4 are described in detail with reference to FIG. 2. FIG. 2 is a block diagram illustrating the memory cell array 1 and the first and second page buffers 3 and 4 in detail. Also, sense amplifiers 14 and 15 are formed between the memory cell array 1 and the first page buffer 3 and between the memory cell array 1 and the second page buffer 4, respectively. First, the memory cell array 1 is described.

<Detail of Memory Cell Array 1>

As illustrated, the memory cell array 1 comprises blocks BLK0 to BLKs (s is a natural number) including a plurality of nonvolatile memory cell transistors MT. As illustrated, each of the blocks BLK0 to BLKs comprises a plurality of NAND strings 11 obtained by connecting the nonvolatile memory cell transistors MT in series. Each of the NAND strings 11 includes 16 memory cell transistors MT and select transistors ST1 and ST2, for example. The memory cell transistor MT has a MONOS structure. The MONOS structure comprises the charge accumulation layer (for example, an insulating layer) formed on a semiconductor substrate through a gate insulating film, an insulating film (hereinafter, referred to as a block layer) formed on the charge accumulation layer and having a dielectric constant higher than that of the charge accumulation layer, and a control gate electrode further formed on the block layer. The number of the memory transistors MT is not limited to 16, and may be 32, 64, 128 etc., i.e., there is no limitation. The adjacent memory cell transistors MT share the source and the drain. Current pathways of the memory cell transistors MT are connected in series and disposed between the select transistors ST1 and ST2. A drain area on one end side of the memory cell transistors MT connected in series is connected to a source area of the select transistor ST1, and a source area on the other end side thereof is connected to a drain area of the select transistor ST2.

The control gate electrodes of the memory cell transistors MT on the same row are commonly connected to any one of the word lines WL0 to WL15. The gate electrodes of the select transistors ST1 on the same row are commonly connected to the select gate line SGD1. The gate electrodes of the select transistors ST2 on the same row are commonly connected to the selected gate line SGS1. In order to simplify the description, the word lines WL0 to WL15 are hereinafter sometimes simply referred to as word lines WL when they are not distinguished from one another. In the memory cell array 1, the drains of the select transistors ST1 on the same column are commonly connected to any one of bit lines BL0 to BLn. For the bit lines BL0 to BLn (n is a natural number) too, when they are not distinguished from one another, hereinafter, they are collectively referred to as bit lines BL. A plurality of bit lines BL are alternately connected to either one of the sense amplifiers 14 and 15. Specifically, one end of a current pathway of the bit line BL0 is connected to the sense amplifier 14. The other end of the current pathway of the bit line BL0 is connected to a drain area of the select transistor ST1 of the NAND string 11 formed on the block BLK0, the drain area of the select transistor ST1 of the NAND string 11 formed on the block BLK1, . . . , and the drain area of the select transistor ST1 of the NAND string 11 formed on the block BLKs.

One end of the current pathway of the bit line BL1 is connected to the sense amplifier 15. The other end of the current pathway of the bit line BL1 is respectively connected to the drain area of the select transistor ST1 of the NAND string 11 formed on the block BLK0, . . . , and the drain area of the select transistor ST1 of the NAND string 11 formed on the block BLKs.

Hereinafter, similarly, one end of the current pathway of the bit line BLn is connected to the sense amplifier 15 and the other end of the current pathway is connected to the drain area of the select transistor ST1 of the NAND string 11 formed on the block BLK0, the drain area of the select transistor ST1 of the NAND string 11 formed on the block BLK1, . . . , and the drain area of the select transistor ST1 of the NAND string 11 formed on the block BLKs. One end of the current pathway of the bit line BL(n+1) is connected to the sense amplifier 14, and the other end of the current pathway is connected to the drain area of the select transistor ST1 of the NAND string 11 formed on the block BLK0, . . . , and the drain area of the select transistor ST1 of the NAND string 11 formed on the block BLKs. Sources of the select transistors ST2 are commonly connected to the source line SL.

The data is collectively written into a plurality of memory cell transistors MT connected to the same word line WL, and this unit is referred to as a page. Further, the data is collectively deleted for a plurality of NAND strings 11 in block BLK units.

<Regarding Sense Amplifiers 14 and 15>

Next, the sense amplifiers 14 and 15 are described. As illustrated, one ends of the current pathways of the sense amplifiers 14 and 15 are connected to the above-described memory cell array 1 by means of the bit lines BL. The other end of the current pathway of the sense amplifier 14 is connected to the first page buffer 3 through signal lines SEL3. The other end of the current pathway of the sense amplifier 15 is connected to the second page buffer 4 through signal lines SEL4. The number of the signal lines SEL3 is the same as the number of the bit lines BL which connect the memory cell array 1 and the sense amplifier 14. This also applies to the signal lines SEL4.

Specifically, signal lines $SEL3_1$ to $SEL3_8$ correspond to the bit lines BL0, BL2, . . . , and BL14, respectively, and signal lines $SEL4_1$ to $SEL4_8$ correspond to the bit lines BL1, BL3, . . . , and BL15, respectively. Hereinafter, this also applies to signal lines $SEL3_9$ to $SEL3_{16}$ and signal lines $SEL4_9$ to $SEL4_{16}$. Meanwhile, when the signal lines $SEL3_1$ to $SEL3_l$ (l is a natural number) are not distinguished from one another, they are simply referred to as signal lines SEL3. This also applies to the signal lines SEL4.

When reading data, the sense amplifiers 14 and 15 sense and amplify the data read from the memory cell array 1 to the bit lines BL and transfer the data to the first and second buffers 3 and 4 through the signal lines SEL3 and SEL4, respectively. When writing data, the sense amplifiers 14 and 15 receive the data provided in the first and second page buffers 3 and 4 through the signal lines SEL3 and SEL4, respectively, and transfer the data to the corresponding bit lines BL, thereby executing the writing into the memory cell array 1.

<Detail of First and Second Page Buffers 3 and 4>

Next, the first and second page buffers 3 and 4 are described. First, the first page buffer 3 is described. As illustrated, the first page buffer 3 comprises buffer units $BU3_1$, $BU3_2$, . . . , and $BU3_m$ (m is a natural number) and a data selecting unit 31. Eight signal lines SEL3 of the signal lines $SEL3_1$ to $SEL3_l$ are connected to one end of each of the current pathways of the buffer units $BU3_1$, $BU3_2$, ..., and $BU3_m$ as described above. Eight I/O_A lines of an I/O_$A_1$ line to an I/O_$A_l$ line corresponding to the signal lines $SEL3_1$ to $SEL3_l$ are connected to the other ends of the current pathways of the buffer units $BU3_1$, $BU3_2$, ..., and $BU3_m$. Specifically, the signal lines $SEL3_1$ to $SEL3_8$ are connected to one end of the current pathway of the buffer unit $BU3_1$, and the I/O_$A_1$ line to the I/O_$A_8$ line are connected to the other end thereof. Hereinafter, similarly, the signal lines $SEL3_9$ to $SEL3_{16}$ are connected to one end of the current pathway of the buffer unit $BU3_2$ and the I/O_$A_9$ line to the I/O_$A_{16}$ line are connected to the other end thereof.

That is to say, the buffer units $BU3_1$ to $BU3_m$ temporarily hold the data transferred from the sense amplifier 14 through the signal lines $SEL3_1$ to $SEL3_l$ and transfer the data to the I/O_$A_1$ line to the I/O_$A_l$ line.

When the buffer units $BU3_1$, $BU3_2$, ..., and $BU3_m$ are not distinguished from one another, they are simply referred to as buffer units BU3. This also applies to buffer units BU4.

The I/O_$A_1$ line to the I/O_$A_l$ line are connected to any one of a YI/O_$A_1$ line to a YI/O_$A_8$ line. Specifically, the I/O_$A_1$ line to the I/O_$A_8$ line are connected to the YI/O_$A_1$ line to the YI/O_$A_8$ line, respectively. Hereinafter, similarly, the I/O_$A_9$ line to the I/O_$A_{16}$ line are connected to the YI/O_$A_1$ line to the YI/O_$A_8$ line, respectively. Accordingly, the YI/O_A lines transfer 8-bit data to the data transfer control circuit 7.

The data selecting unit 31 selects any one of the buffer units $BU3_1$ to $BU3_m$ according to the control signal of the control circuit 8. Accordingly, when reading data from the selected buffer unit BU3, the data held in the buffer unit BU3 is transferred to the YI/O_$A_1$ line to the YI/O_$A_8$ line and to the data transfer control circuit 7 through the I/O_$A_1$ line to the I/O_$A_8$ line. In this embodiment, a bit number input and output between the YI/O_$A_1$ line to the YI/O_$A_8$ line and the data transfer control circuit 7 is made 8-bit, for example. Incidentally, the number of YI/O_A lines is not limited to eight, and may be 16, 32, 64, etc., i.e., there is no limitation. This is described later, in a second modified example.

Next, the second page buffer 4 is described. As illustrated, the second page buffer 4 comprises buffer units $BU4_1$, $BU4_2$, ..., and $BU4_m$ (m is a natural number) and a data selecting unit 41. As described above, eight signal lines SEL4 of the signal lines $SEL4_1$ to $SEL4_l$ are connected to one end of each of the current pathways of the buffer units $BU4_1$, $BU4_2$, ..., and $BU4_m$. Eight I/O_B lines of an I/O_$B_1$ line to an I/O_$B_l$ line corresponding to the signal lines $SEL4_1$ to $SEL4_l$ are connected to the other ends of the current pathways of the buffer units $BU4_1$, $BU4_2$, ..., and $BU4_m$. Specifically, the signal lines $SEL4_1$ to $SEL4_8$ are connected to one end of the current pathway of the buffer unit $BU4_1$, and the I/O_$B_1$ line to the I/O_$B_8$ line are connected to the other end thereof. Hereinafter, similarly, the signal lines $SEL4_9$ to $SEL4_{16}$ are connected to one end of the current pathway of the buffer unit $BU4_2$ and the I/O_$B_9$ line to the I/O_$B_{16}$ line are connected to the other end thereof.

The I/O_$B_1$ line to the I/O_$B_l$ line are respectively connected to any one of a YI/O_$B_1$ line to a YI/O_$B_l$ line. Specifically, the I/O_$B_1$ line to the I/O_$B_8$ line are connected to the YI/O_$B_1$ line to the YI/O_$B_8$ line, respectively. Hereinafter, similarly, the I/O_$B_9$ line to the I/O_$B_{16}$ line are connected to the YI/O_$B_1$ line to the YI/O_$B_8$ line, respectively. Accordingly, the YI/O_B lines transfer the 8-bit data to the data transfer control circuit 7.

That is to say, the buffer units $BU4_1$ to $BU4_m$ temporarily hold the data transferred from the sense amplifier 15 through the signal lines $SEL4_1$ to $SEL4_l$ and transfer the data to the I/O_$B_1$ line to the I/O_$B_l$ line.

The data selecting unit 41 selects any one of the buffer units $BU4_1$ to $BU4_m$ according to the control signal of the control circuit 8. Accordingly, when reading the data from the selected buffer unit BU4, the data held in the buffer unit BU4 is transferred to the YI/O_$B_1$ line to the YI/O_$B_8$ line and to the data transfer control circuit 7 through the I/O_$B_1$ line to the I/O_$B_l$ line. Herein, in this embodiment, the bit number input and output between the YI/O_$B_1$ line to the YI/O_$B_8$ line and the data transfer control circuit 7 is made 8-bit, as an example. Meanwhile, the number of YI/O_B lines is not limited to eight, and may be 16, 32, 64 and the like, i.e., there is no limitation. Meanwhile, the number of YI/O_B lines is described in the second modified example, later.

<Detail of Internal Control Signal Generated by Internal Control Signal Generating Circuit 9 (1)>

Next, the internal control signal generated by the internal control signal generating circuit 9 is described in detail with reference to FIG. 3. FIG. 3 is a block diagram of the data transfer control circuit 7, the internal control signal generating circuit 9, which controls the data transfer control circuit 7 by the internal control signal, the input pad 13 and the input buffer 12. Herein, it is particularly described using the internal control signal generated by the internal control signal generating circuit 9 when reading the data. A description of the signal $D_{OUT}$ output from the data transfer control circuit 7 to the $DQS_{OUT}$ 14 is omitted. Hereinafter, this also applies to the embodiment. A description of the portion already illustrated in FIG. 1 is omitted.

As illustrated, the data transfer control circuit 7 comprises a LAT 71 and a LAT 72. The LAT 71 comprises a data latch A1 and a data latch A2. The above-described YI/O_A lines from the first page buffer 3 are connected to one end of a current pathway of the data latch A1. The other end of the current pathway of the data latch A1 and one end of a current pathway of the data latch A2 are connected by means of the YI/O_A1 lines. A signal /RECLK from the internal control signal generating circuit 9 is supplied to the data latch A1. The number of YI/O_A lines and YI/O_A1 lines is the same.

Further, the other end of the current pathway of the data latch A2 is connected to one end of a current pathway of the output buffer 10 by a signal line. The data latch A2 outputs the 8-bit data, for example, which passes through the above-described YI/O_A1 lines to the output buffer 10. A signal /REOLAT_A is supplied from the internal control signal generating circuit 9 to the data latch A2.

When the signal /RE_CLK is supplied to the data latch A1, the data latch A1 captures the 8-bit data, for example, supplied from the YI/O_A lines to the data latch A1, that is to say, itself. However, the data latch A1 keeps holding the data even after transferring the data to the data latch A2 unless the data latch A receives new data. This also applies to a data latch B1.

When the signal REOLAT_A is supplied to the data latch A2, the data latch A2 directly transfers the 8-bit data, for example, transferred to itself, that is to say, the data latch A2 from the above-described data latch A1 through the YI/O_A1 lines to the output pad 10. However, the data latch A2 keeps holding the data even after transferring the data to the output pad 10 unless the data latch A1 is asserted and the data latch A2 receives new data from the data latch A1. This also applies to a data latch B2 to be described later.

The LAT 72 comprises the data latch B1 and the data latch B2. The above-described YI/O_B lines from the second page buffer 4 are connected to one end of a current pathway of the data latch B1. The other end of the current pathway of the data latch B1 and one end of a current pathway of the data latch B2 are connected by means of the YI/O_B1 lines. The signal /RECLK is supplied from the internal control signal generating circuit 9 to the data latch B1. The number of YI/O_B lines and YI/O_B1 lines is the same. The other end of the current pathway of the data latch B2 is connected to one end of the current pathway of the output buffer 10 by means of the signal line. The data latch B2 outputs the 8-bit data, for example, which passes through the above-described YI/O_B1 lines to the output buffer 10. A signal /REOLAT_B is supplied from the internal control signal generating circuit 9 to the data latch B2.

When the signal /RE_CLK is supplied to the data latch B1, the data latch B1 captures the 8-bit data, for example, supplied from the YI/O_B lines to the data latch B1. When the signal /REOLAT_B is supplied to the data latch B2, the data latch B2 directly transfers the 8-bit data, for example, transferred from the above-described data latch B1 to itself, that is to say, the data latch B2 through the YI/O_B1 lines to the output pad 10.

The internal control signal generating circuit 9 generates the internal control signal such as the signal /RE_CLK, the signal REOLAT_A and the signal REOLAT_B according to the control signal supplied from outside through the input pad 13 and the input buffer 12. Specifically, this generates the above-described internal control signals according to a control signal /RE. Also, the internal control signal generating circuit 9 generates the internal control signal such as a signal REn_CLK and an unillustrated signal REOLAT according to the control signal /RE. As illustrated, the signal RE_CLK generated by the internal control signal generating circuit 9 is supplied to the data latches A1 and B1. The signal REOLAT_A generated by the internal control signal generating circuit 9 is supplied to the data latch A2 and the signal REOLAT_B is supplied to the data latch B2. Accordingly, the transfer of data is executed between the memory cell array 1 and an unillustrated host.

<Detail of Internal Control Signal Generated by Internal Control Signal Generating Circuit 9 (2)>

Next, the internal control signal generated by the internal control signal generating circuit 9 is described in detail with reference to FIG. 4. FIG. 4 particularly illustrates the internal control signal generated by the internal control signal generating circuit 9 when writing data in FIG. 3. That is to say, the 8-bit data, for example, supplied from an unillustrated host through the input pad 13 and the input buffer 12 is respectively transferred to the first and second page buffers 3 and 4 through the LAT 71 and the LAT 72. Thereafter, the data is written into the memory cell array 1. A description of the portion already illustrated in FIGS. 1 and 3 is omitted.

The internal control signal generating circuit 9 generates the internal control signal such as a signal WE_CLK, a signal WEn_A and a signal WEn_B according to the control signal supplied from outside through the input pad 13, the input buffer 12 and the $DQS_{IN}$ 15. Specifically, the internal control signal generating circuit 9 generates the above-described internal control signal according to the control signal /WE (signal $D_{IN}$). The internal control signal generating circuit 9 generates the internal control signal such as a signal WEn_CLK and an unillustrated signal WEn according to the control signal /WE. As illustrated, the signal WE_CLK generated by the internal control signal generating circuit 9 is supplied to the data latches A1 and B1. The signal WEn_A generated by the internal control signal generating circuit 9 is supplied to the data latch A2 and the signal WEn_B is supplied to the data latch B2. Accordingly, the transfer of the data is executed between the memory cell array 1 and an unillustrated host. Hereinafter, this is specifically described.

When the signal WEn_A is supplied to the data latch A2, the data latch A2 holds the 8-bit data, for example, transferred from an unillustrated host through the input pad 13 and the input buffer 12 in the data latch A2, that is to say, itself.

When the signal WEn_B is supplied to the data latch B2, the data latch B2 holds the 8-bit data, for example, transferred from an unillustrated host through the input pad 13 and the input buffer 12 in the data latch B2, that is to say, itself.

When the signal WE_CLK is supplied to the data latch A1, the data latch A1 directly transfers the 8-bit data, for example, transferred from the above-described data latch A2 to the data latch A1 through the YI/O_A1 lines to the memory cell array 1 through the YI/O_A lines and the first page buffer 3. However, the data latch A2 keeps holding the data even after transferring the data to the data latch 1 unless the data latch A2 receives the new data from the input buffer 12. This also applies to the data latch B2 to be described later. As for the data latch A1 also, the data latch A1 keeps holding the data even after transferring the 8-bit data to the memory cell array 1 unless the data latch A2 is asserted and the data latch A1 receives the new data from the data latch A2. This also applies to the data latch B1 to be described later.

Similarly, when the signal WE_CLK is supplied to the data latch B1, the data latch B1 directly transfers the 8-bit data, for example, transferred from the above-described data latch B2 to the data latch B1 through the YI/O_B1 lines to the memory cell array 1 through the YI/O_B lines and the second page buffer 4.

<Reading Operation>

Figure 5:
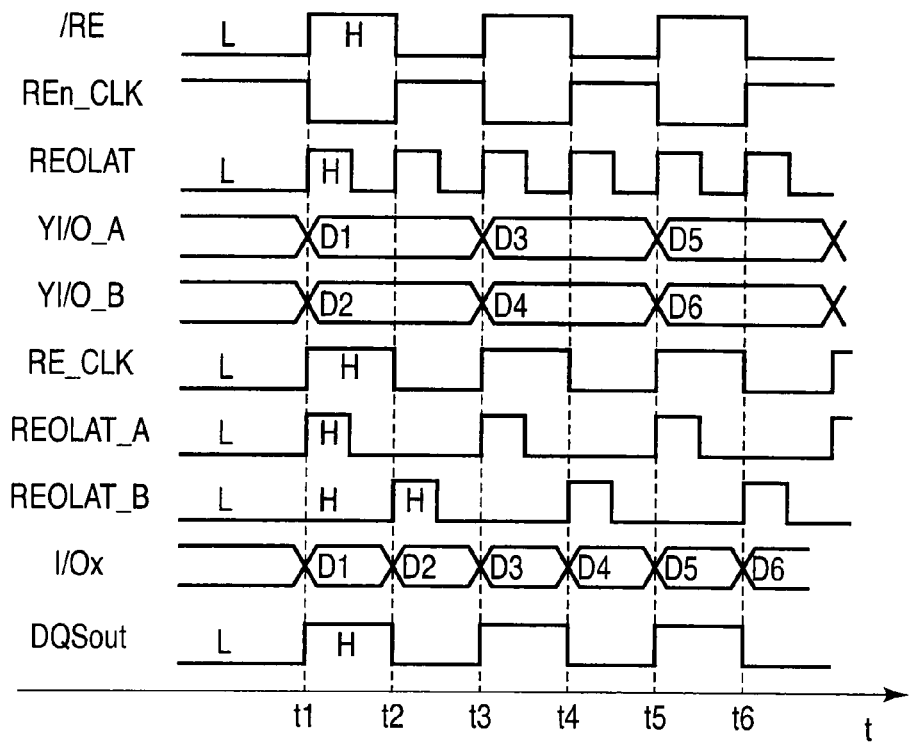
FIGS. 5 and 6 are time charts of signals during data reading and writing to/from the NAND-type flash memory according to the first embodiment of the invention.

Next, an operation when the NAND-type flash memory outputs data to an unillustrated host in the above-described configuration is described with reference to FIG. 5. FIG. 5 illustrates a reading operation of the NAND-type flash memory and is a time chart of the control signal /RE, the signal REn_CLK, the signal REOLAT, the data which passes through the YI/O_A lines, the data which passes through the YI/O_B lines, the signal RE_CLK, the signal REOLAT_A, the signal REOLAT_B, the data which passes through the output pad 12 (represented as I/Ox in the drawing), and the signal output by the $DQS_{OUT}$ 14. The above-described signals and data are represented along a longitudinal axis and time t is represented along an abscissa axis.

First, when the control signal /RE supplied from an unillustrated host is set to an 'H' level at a time point t1, the signal REn_CLK output by the internal signal generating circuit 9 is set to an 'L' level and the signal RE_CLK is set to the 'H' level. As a result, the 8-bit data, for example (represented as D1 and D2 in the drawing), transferred from the first and second page buffers 3 and 4 are held in the data latches A1 and B1. Then, at the same time point t1, the signal REOLAT is set to the 'H' level. Accordingly, the signal REOLAT_A is set to the 'H' level in accordance with the rising of the signal /RE. Based on the signal REOLAT_A set to the 'H' level, the data (D1) held in the data latch A1 is transferred to an unillustrated host through the data latch A2, the output buffer 10 and the output pad 11. At the time point t1, the signal $D_{OUT}$ is set to the 'H' level in synchronization with the output of the data (D1).

At a time point t2, the signal /RE is set to the 'L' level and the signal REOLAT is set to the 'H' level. Accordingly, based on the signal /RE, the signal REOLAT_B is set to the 'H' level. Based on the signal REOLAT_B, which is set to the 'H' level, the data (D2) held in the data latch B1 is transferred to an unillustrated host through the data latch B2, the output buffer 10 and the output pad 11 at the time point t2. At the time point t2, the signal $D_{OUT}$ is set to the 'L' level in synchronization with the output of the data (D2).

At a time point t3, when the signal /RE is again set to the 'H' level, the signal REn_CLK is set to the 'L' level and the signal RE_CLK is set to the 'H' level. Accordingly, the 8-bit data, for example (represented as D3 and D4 in the drawing), transferred from the first and second page buffers 3 and 4 is held in the data latches A1 and B1. At the same time point t3, the signal /RE is set to the 'H' level and the signal REOLAT is set to the 'H' level. The signal REOLAT_A is again set to the 'H' level in synchronization with the signal REOLAT set to the 'H' level. Accordingly, the data (D3) held in the data latch A1 is transferred to an unillustrated host through the data latch A2, the output buffer 10 and the output pad 11. At the time point t3, the signal $D_{OUT}$ is set to the 'H' level in synchronization with the output of the data (D3).

At a time point t4, the signal /RE is set to the 'L' level and the signal REOLAT is set to the 'H' level. The signal REOLAT_B is again set to the 'H' level in synchronization with the signal REOLAT set to the 'H' level. Accordingly, the data (D4) held in the data latch B1 is transferred to an unillustrated host through the data latch B2, the output buffer 10 and the output pad 11. At the time point t4, the signal $D_{OUT}$ is set to the 'L' level in synchronization with the output of the data (D4).

Hereinafter, this also applies to the data (represented as D5 and D6 in the drawing) transferred to an unillustrated host through the output buffer 10 and the output pad 11 at time points t5 and t6. As described above, the output pad 11 alternately outputs the read data supplied from the first and second page buffers 3 and 4.

The output of the signal $D_{OUT}$ may be set to the 'L' level at the time points t1, t3 and t5 and to the 'H' level at the time points t2, t4 and t6. That is to say, it is only necessary that an unillustrated host recognizes a transmission timing of the read data according to the output of the signal $D_{OUT}$. This also applies to the embodiment to be described hereinafter.

<Writing Operation>

Figure 6:
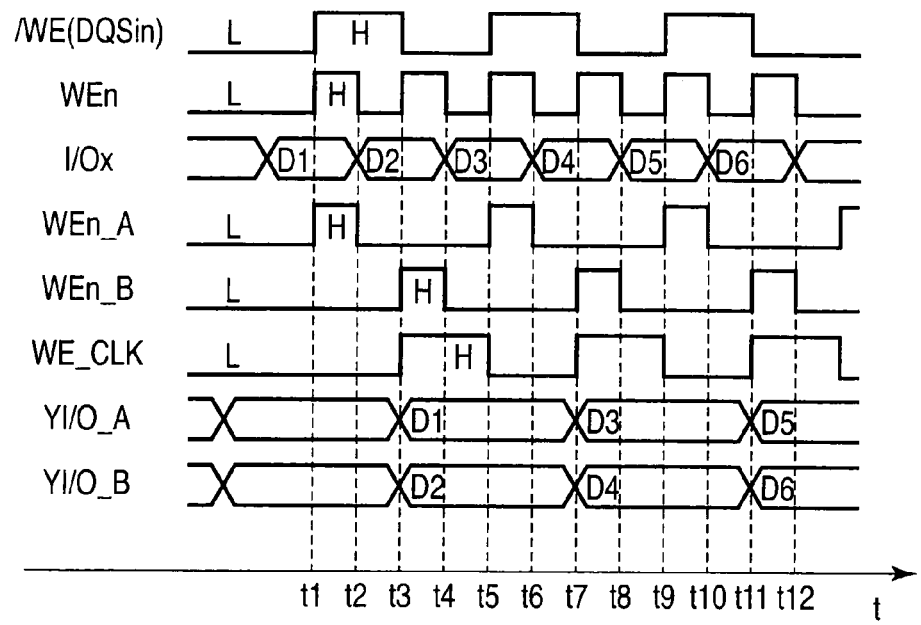

Next, an operation when data is input from an unillustrated host to the NAND-type flash memory in the above-described configuration is described with reference to FIG. 6. That is to say, FIG. 6 illustrates a writing operation of data to the NAND-type flash memory, and is a time chart of the control signal /WE (signal $D_{IN}$), the signal WEn, the data, which passes through the input pad 13 and the input buffer 12 (represented as I/Ox in the drawing), the signal WE_A, the signal WE_B, the signal WE_CLK, the data which passes through the YI/O_A lines, and the data which passes through the YI/O_B lines. The above-described signals and data are represented along the longitudinal axis and time t is represented along the abscissa axis.

As illustrated, at the time point t1, the 8-bit data, for example (D1 in the drawing), from an unillustrated host is held in the input pad 13 and the input buffer 12. When the control signal /WE (signal signal WEn is set to the 'H' level by the internal control signal generating circuit 9. Also, at the same time point t1, the signal WEn_A is set to the 'H' level in accordance with rising of the above-described control signal /WE (signal $D_{IN}$). Accordingly, the data (D1) is held in the data latch A2.

At the time point t2, the 8-bit data, for example (D2 in the drawings), from an unillustrated host is held in the input pad 13 and the input buffer 12. At the time point t3, the control signal /WE (signal $D_{IN}$) is set to the 'L' level and the signal WEn is set to the 'H' level. Therefore, at the same time point t3, the signal WEn_B is set to the 'H' level in accordance with the falling of the above-described control signal /WE (signal $D_{IN}$). Accordingly, the data (D2) is held in the data latch B2.

In accordance with the falling of the control signal /WE (signal $D_{IN}$) at the same time point t3, the signal WE_CLK, which is set to the 'H' level, is supplied to the data latches A1 and B1 by the internal control signal generating circuit 9. As a result, the data D1 is transferred from the data latch A2 to the first page buffer 3 through the data latch A1 and the YI/O_A lines and the data D2 is transferred from the data latch B2 to the second page buffer 4 through the data latch B1 and the YI/O_B lines. Hereinafter, similarly, the data (D3 to D6) are captured in the data transfer control circuit 7. That is to say, the data (D3 and D5) from the input buffer 12 are held in the data latch A2 by the signal WEn_A, which is set to the 'H' level at time points t5 and t9, and the data (D3 and D5) are transferred from the data latch A2 to the first page buffer 3 through the data latch A1 by the signal WE_CLK, which is set to the 'H' level at time points t7 and t11. The data (D4 and D6) held in the second data latch B2 by the signal WEn_B, which is set to the 'H' level at the time points t7 and t11, are transferred to the second page buffer 4 through the data latch B1 by the signal WE_CLK, which is set to the 'H' level at the same time points t7 and t11. As described above, the write data supplied from an unillustrated host to the input pad 13 is alternately transferred to the first and second page buffers 3 and 4.

In the nonvolatile semiconductor memory apparatus according to this embodiment, as described above, the same number of YI/O_A lines and YI/O_B lines as data lines provided in the output pad 11 and the input pad 13 (eight in this embodiment, that is to say, 8 bits) are connected to the first and second page buffers 3 and 4, respectively. That is to say, as described above, eight YI/O_A lines and eight YI/O_B lines are formed in this embodiment. The data transfer control circuit 7 comprises the LAT 71 and the LAT 72 in which one ends of the current pathways are connected to the YI/O_A lines and the YI/O_B lines, respectively.

According to the above, when reading data, high-speed transfer is possible by transferring the 8-bit data transferred from the memory cell array 1 to the LAT 71 and the LAT 72 and alternately outputting the above-described 8-bit data from the LAT 71 and the LAT 72 to an unillustrated host through the output buffer 10 and the output pad 11. This is because the data is output from the LAT 71 to the output buffer 10 in synchronization with the rising of the control signal /RE supplied from an unillustrated host and the data is output from the LAT 72 to the output buffer 10 in synchronization with the falling of the control signal /RE. That is to say, high-speed data transfer becomes possible by outputting the 8-bit data, for example, read from the memory cell array 1 by the first and second page buffers 3 and 4 from the LAT 71 and the LAT 72 to the output buffer 10 and the output pad 11 in a time division manner in one clock of the control signal /RE.

Also, in the nonvolatile semiconductor memory apparatus 100 according to this embodiment, the signal $D_{OUT}$ is output to an unillustrated host. An unillustrated host monitors the signal $D_{OUT}$. As described above, the signal $D_{OUT}$ is synchronized with the read data output from the output pad 11 in the toggle mode (refer to FIGS. 5 and 9). According to this, an unillustrated host may read the read data high-speed transferred from the nonvolatile semiconductor memory apparatus 100 by synchronizing the read timing with the signal $D_{OUT}$. This is because the signal $D_{OUT}$ serves as a control signal for an unillustrated host to correctly read the high-speed transferred data.

On the other hand, at the time of the writing also, the 8-bit data, for example, captured from an unillustrated host to the memory cell array 1 through the input pad 13 and the input buffer 12, for example, is alternately transferred to the LAT 71 and the LAT 72 in an 8-bit state. That is to say, the data is captured in the LAT 71 in synchronization with the rising of the control signal /WE supplied from an unillustrated host, and the data is captured in the LAT 72 in synchronization with the falling of the control signal /WE. That is to say, in the NAND-type flash memory, the 8-bit data which is transferred from an unillustrated host, is distributed to the LAT 71 and the LAT 72 in synchronization with the rising and the falling of the control signal /WE, thereby enabling high-speed data transfer.

Second Embodiment

Next, in the nonvolatile semiconductor memory apparatus 100 according to a second embodiment of the invention, the internal control signal generated by the internal control signal generating circuit 9 is particularly described with reference to FIGS. 7 and 8. FIGS. 7 and 8 are respective block diagrams of the internal control signal generating circuit 9, the data transfer control circuit 7, the input pad 13, the input buffer 12, the output pad 11 and the output buffer 10. First, it is described with reference to FIG. 7.

<Details of Internal Control Signal Generated by Internal Control Signal Generating Circuit 9 (3)>

The internal control signal generating circuit 9 according to this embodiment is configured to generate a signal RE_CLKA and a signal RE_CLKB in place of the signal RE_CLK described in the first embodiment.

FIG. 7 is the block diagram in which the signal RE_CLKA and the signal RE_CLKB are output to the data transfer control circuit 7. A description of a portion already illustrated in FIGS. 1 and 3 is omitted.

The internal control signal generating circuit 9 generates the signal RE_CLKA and the signal RE_CLKB according to the control signal supplied from outside through the input pad 13 and the input buffer 12. Specifically, the signal RE_CLKA and the signal RE_CLKB are generated as internal control signals by the internal control signal generating circuit 9 according to the control signal /RE. As illustrated, the signal RE_CLKA generated by the internal control signal generating circuit 9 is supplied to the data latch A1 and the signal RE_CLKB is supplied to the data latch B1.

That is to say, the signal RE_CLKA is supplied to the data latch A1, and by this, the 8-bit data, for example, is transferred from the first page buffer 3 through the YI/O_A lines to be held in the data latch A1. Similarly, the signal RE_CLKB is supplied to the data latch B1, and by this, the 8-bit data, for example, is transferred from the second page buffer 4 through the YI/O_B lines to be held in the data latch B1.

<Details of Internal Control Signal Generated by Internal Control Signal Generating Circuit 9 (4)>

Next, a case in which the internal control signal generated by the internal control signal generating circuit 9 is supplied to the data transfer control circuit 7 when writing data is particularly described with reference to FIG. 8. The internal control signal generating circuit 9 according to this embodiment is configured to generate a signal WE_CLKA and a signal WE_CLKB in place of the signal RE_CLK described in the above-described first embodiment.

FIG. 8 is the block diagram in which the signal WE_CLKA and the signal WE_CLKB are output to the data transfer control circuit 7. A description of a portion already illustrated in FIGS. 1 and 4 is omitted.

The internal control signal generating circuit 9 generates the signal WE_CLKA and the signal WE_CLKB according to the control signal supplied from outside through the input pad 13, the input buffer 12 and the $DQS_{IN}$ 15. Specifically, according to the control signal /WE (signal $D_{IN}$), the signal WE_CLKA and the signal WE_CLKB are generated as internal control signals by the internal control signal generating circuit 9. As illustrated, the signal WE_CLKA generated by the internal control signal generating circuit 9 is supplied to the data latch A1 and the signal WE_CLKB is supplied to the data latch B1.

That is to say, the signal WE_CLKA is supplied to the data latch A1, and by this, the 8-bit data, for example, held in the data latch A2 is transferred from the data latch A2 to the data latch A1, and thereafter transferred to the first page buffer 3 through the data latch A1. Similarly, the signal WE_CLKB is supplied to the data latch B1, and thereby, the 8-bit data, for example, held in the data latch B2 is transferred from the data latch B2 to the data latch B1, and thereafter transferred to the second page buffer 4 through the data latch B1.

<Reading Operation>

Figure 9:
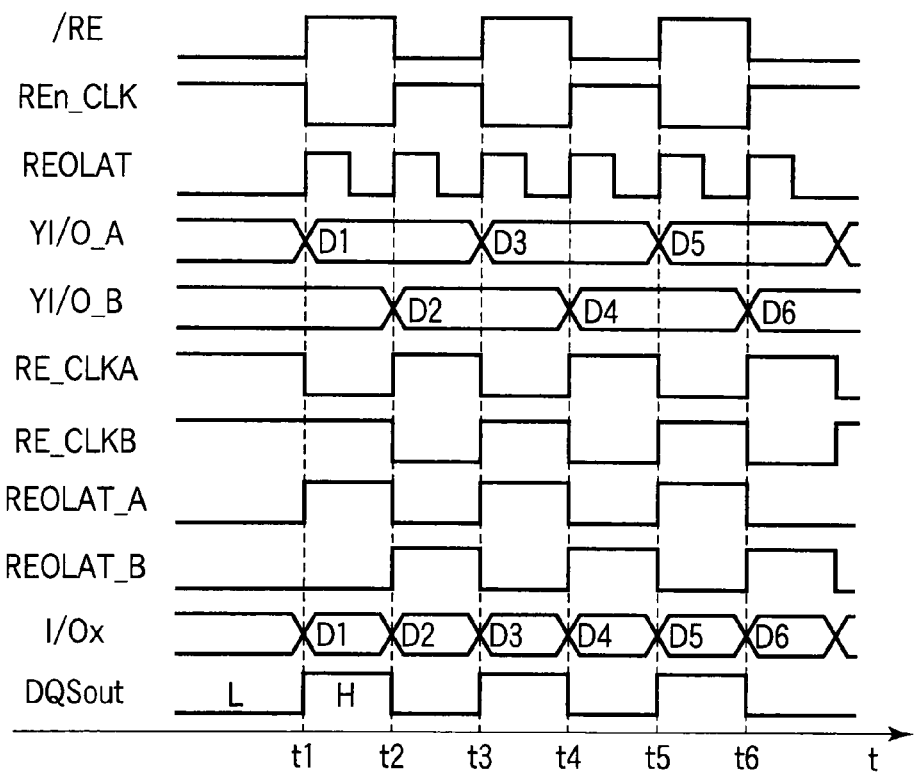
FIGS. 9 and 10 are time charts of signals during data reading and writing to/from the NAND-type flash memory according to the second embodiment of the invention.

Next, the operation when the NAND-type flash memory outputs the data to an unillustrated host in the configuration according to this embodiment is described with reference to FIG. 9. FIG. 9 illustrates the reading operation of the NAND-type flash memory and is a time chart of the control signal /RE, the signal REn_CLK, the signal REOLAT, the data which passes through the YI/O_A lines, the data which passes through the YI/O_B lines, the signal RE_CLKA, the signal RE_CLKB, the signal REOLAT_A, the signal REOLAT_B, the data which passes through the output pad 12 (represented as I/Ox in the drawing), and the signal output by the $DQS_{OUT}$ 14. The above-described signals and data are represented along the longitudinal axis and the time t is represented along the abscissa axis. In the data transfer control circuit 7 according to this embodiment, by the falling of signal RE_CLKA and the signal RE_CLKB generated by the internal control signal generating circuit 9, the 8-bit data, for example, is held in the data latches A1 and B1. A description of operation already described in the reading operation described in the first embodiment is omitted.

First, at the time point t1, the signal RE_CLKA supplied to the data latch A1 in accordance with the rising of the control signal /RE is set to the 'L' level. At the same time point t1, the signal REOLAT_A of the 'H' level is supplied to the data latch A2 in accordance with the rising of the control signal /RE. Accordingly, at the time point t1, the data (represented as D1 in the drawing) transferred from the first page buffer 3 to the data latch A1 is transferred to the output buffer 10 from the data latch A1 through the data latch A2. At the time point t1, the signal is set to the 'H' level in synchronization with output of the data (D1).

Next, at the time point t2, the signal RE_CLKB supplied to the data latch B1 in accordance with the falling of the control signal /RE is set to the 'L' level. At the same time point t2, the signal REOLAT_B of the 'H' level is supplied to the data latch B2 in accordance with the falling of the control signal /RE. Accordingly, at the time point t2, the data (represented as D2 in the drawing) transferred from the second page buffer 4 to the data latch B1 is transferred from the data latch B1 to the output buffer 10 through the data latch B2. At the time point t2, the signal $D_{OUT}$ is set to the 'L' level in synchronization with the output of the data (D2).

Hereinafter, similarly, at the time points t3 and t5, the data (represented as D3 and D5 in the drawing) are transferred from the first page buffer 3 to the output buffer 10 through the data latches A1 and A2. At the time points t3 and t5, in synchronization with the output of the data (D3 and D5), the signal $D_{OUT}$ is set to the 'H' level. Similarly, at the time points t4 and t6, the data (represented as D4 and D6 in the drawing) is transferred from the second page buffer 4 to the output buffer 10 through the data latches B1 and B2. At the time points t4 and t6, in synchronization with the output of the data (D4 and D6), the signal is set to the 'L' level. As described above, the output pad 11 alternately outputs the read data supplied from the first and second page buffers 3 and 4.

<Writing Operation>

Figure 10:
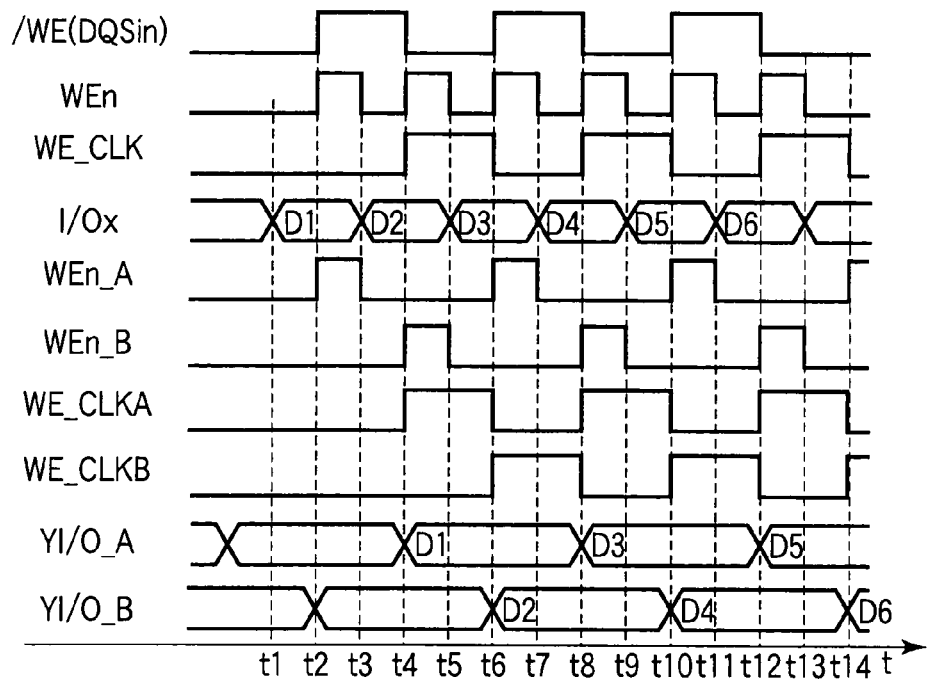

Next, the operation when the data is input from an unillustrated host to the NAND-type flash memory in the configuration according to this embodiment is described with reference to FIG. 10. FIG. 10 is the writing operation of the data to the NAND-type flash memory and is a time chart of the control signal /WE (signal $D_{IN}$), the signal WEn, the signal WE_CLK, the data (represented as I/Ox in the drawing) which passes through the input pad 13 and the input buffer 12, the signal WE_A, the signal WE_B, the signal WE_CLKA, the signal WE_CLKB, the data which passes through the YI/O_A lines, and the data, which passes through the YI/O_B lines. The above-described signals and the data are represented along the longitudinal axis and time t is represented along the abscissa axis.

When writing data, the data transfer control circuit 7 according to this embodiment is configured to hold the 8-bit data, for example, transferred from an unillustrated host in the data latches A2 and B2, and thereafter alternately transfer the data to the first and second page buffers 3 and 4 in synchronization with the signals WE_CLKA and WE_CLKB. A description of the operation already described in the writing operation described in the first embodiment is omitted.

At the time point t4, in accordance with the falling of the control signal /WE (signal $D_{IN}$), the signal WE_CLKA supplied to the data latch A1 is set to the 'H' level. Accordingly, the 8-bit data, for example (represented as D1 in the drawing), is held in the data latch A1 and the data is transferred to the first page buffer 3 through the YI/O_A lines. At the time point t6, in accordance with the rising of the control signal /WE (signal $D_{IN}$), the signal WE_CLKB supplied to the data latch B1 is set to the 'H' level. Accordingly, the 8-bit data, for example (represented as D2 in the drawing), is held in the data latch B1 and is transferred to the second page buffer 4 through the YI/O_B lines.

Hereinafter, similarly, at time points t8 and t12, the data (represented as D3 and D5 in the drawing) are transferred to the first page buffer 3 through the data latch A1 and the YI/O_A lines, and at time points t10 and t14, the data (represented as D4 and D6 in the drawing) are transferred to the second page buffer 4 through the data latch B1 and the YI/O_B lines. The write data supplied from an unillustrated host to the input pad 13 is alternately transferred to the first and second page buffers 3 and 4.

In the nonvolatile semiconductor memory apparatus according to this embodiment too, high-speed data transfer becomes possible, as in the first embodiment. That is to say, the data transfer control circuit 7 alternately executes the reading of the data (D1, D3 and D5) from the first page buffer 3 and the reading of the data (D2, D4 and D6) from the second page buffer 4 in a configuration identical to that of the first embodiment, and by this, high-speed data transfer becomes possible. That is to say, by setting the signal RE_CLKA to the 'L' level and the signal REOLAT_A to the 'H' level at the rising of the control signal /RE, the data (D1, D3 and D5) read from the first page buffer 3 are transferred to an unillustrated host through the output buffer 10 and the output pad 11. Thereafter, by setting the signal RE_CLKB to the 'L' level and the signal REOLAT_B to the 'H' level at the falling of the control signal /RE, the data (D2, D4 and D6) read from the second page buffer 4 are transferred to an unillustrated host through the output buffer 10 and the output pad 11. As described above, in the nonvolatile semiconductor memory apparatus according to this embodiment too, the data of the first and second page buffers 3 and 4 may be read in one clock of the control signal /RE when reading the data, so that high-speed data transfer becomes possible.

Also, when writing data, by alternately transferring the 8-bit data, for example, captured in the data transfer control circuit 7 to the YI/O_A lines and the YI/O_B lines, high-speed transfer becomes possible. That is to say, by using the signal WE_CLKA generated at the falling of the control signal /WE and the signal WE_CLKB generated at the rising of the control signal /WE, it is possible to alternately transfer data to the YI/O_A lines and the YI/O_B lines, making high-speed transfer possible.

First Modified Example

Next, the nonvolatile semiconductor memory apparatus 100 according to a first modified example of the embodiment of the invention is described with reference to FIG. 11. The NAND-type flash memory is also described as above as one example of a nonvolatile semiconductor memory apparatus according to the first modified example of this embodiment. FIG. 11 is a block diagram in which one page buffer is formed for one memory cell array 1 capable of holding the data provided in the NAND-type flash memory in FIG. 2. That is to say, a first page buffer 3' is formed in the memory cell array 1 and a second page buffer 4' is formed in a memory cell array 1'. In other words, although two page buffers are provided for the memory cell array including a plurality of blocks BLK sharing the bit line BL in the above-described first and second embodiments, only one page buffer is provided in this modified example.

Herein, configurations of the first and second page buffers 3' and 4' are identical to those of the first and second page buffers 3 and 4, respectively. Since a configuration other than that given above is identical to that of the first and second embodiments, the description thereof is omitted. In the nonvolatile semiconductor memory apparatus 100 according to the modified example of the invention, a control method when reading and writing data is also executed by any of the methods in the above-described first and second embodiments, and the description thereof is omitted. That is to say, in the configuration as shown in FIG. 11 also, data transfer identical to that of the above-described first and second embodiments is executed when writing and reading data.

That is to say, as in the above-described first and second embodiments, the 8-bit data, for example, read from the memory cell array 1 at the time of reading is transferred to the LAT 71 through the first page buffer 3', and the 8-bit data, for example, read from the memory cell array 1' is transferred to the LAT 72 through the second page buffer 4'.

Similarly, when writing data also, as in the above-described first and second embodiments, the 8-bit data, for example, transferred from the input pad 13 and the input buffer 12 is transferred to the first page buffer 1' through the LAT 71 and transferred to the second page buffer 2' through the LAT 72.

As described above, in the nonvolatile semiconductor memory apparatus according to the modified example too, high-speed data transfer becomes possible, as in the above-described first and second embodiments.

Second Modified Example

Next, the nonvolatile semiconductor memory apparatus 100 according to the second modified example of the embodiment of the invention is described. As opposed to the above-described first and second embodiments and the first modified example thereof, in the nonvolatile semiconductor memory apparatus according to the modified example of this embodiment, the number of signal lines I/O provided in the input and output buffers 10 and 11 and the input and output pads 12 and 13 is twice as many as eight. That is to say, the number of signal lines I/O is 16 (16 bits) and the number of YI/O_A lines and YI/O_B lines is also 16.

In this case, the signal lines $SEL3_{(1-16)}$ to $SEL3_l$ are connected to one end of the current pathway of the buffer unit $BU3_m$ and the $I/O\_A_{(1-16)}$ line to the $I/O\_A_{16}$ line are connected to the other end thereof. Then, the data selecting unit 31 selects any one of the buffer units BU3, thereby communicating 16-bit data with an unillustrated host.

Similarly, the signal lines $SEL4_{(1-16)}$ to $SEL4_l$ are connected to one end of the current pathway of the buffer unit $BU4_m$ and the $I/O\_A_{(1-16)}$ line to the $I/O\_A_{16}$ line are connected to the other end thereof. Then, the data selecting unit 41 selects any one of the buffer units BU4, thereby communicating the 16-bit data with an unillustrated host.

Also, when the signal lines $SEL3_{(1-8)}$ to $SEL3_1$ are connected to one end of the current pathway of the buffer unit $BU3_m$ and the $I/O\_A_{(1-8)}$ line to the $I/O\_A_l$ line are connected to the other end thereof, the data selecting unit 31 selects any two of the buffer units BU3, thereby communicating the 16-bit data with an unillustrated host. This also applies to the buffer unit $BU4_m$. In these cases, the NAND string 11 is formed of 32 or more memory cell transistors MT, for example.

Meanwhile, although the case in which the number of signal lines I/O, YI/O_A lines and YI/O_B lines is 16 is described in the above-described second modified example, the number may be 32 or 64, i.e., there is no limitation. In this case also, the number of the memory cell transistors MT forming the NAND string 11 corresponds to the number of signal lines I/O, YI/O_A lines and YI/O_B lines.

As described above, in the nonvolatile semiconductor memory apparatus according to the modified example, high-speed data transfer is also possible, as in the above-described first and second embodiments and modified example thereof.

Note that although the data transfer control circuit 7 comprises the LAT 71 and LAT 72 in the above-described embodiment, only one of them may be used. In this case, either LAT formed in the data transfer control circuit 7 may be controlled by using the internal control signals WEn and REOLAT.

Note also that although the method of writing data according to the control signal /WE (signal $D_{IN}$) is described in the above-described first and second embodiments and the modified example thereof, data may be written using only the signal $D_{IN}$. That is to say, while data is transferred at high speed between the host and the nonvolatile semiconductor memory apparatus 100, it is possible that the control signal /WE, the command signal, will not be able to follow the transfer speed of the data. Therefore, in such a case, the data transfer controlling unit 7 may capture the high-speed transferred data by using the above-described signal $D_{IN}$. That is, in this case, the control signal /WE is used as the command signal, and signal $D_{IN}$ is used as input of data.

Further, the memory cell transistor MT may be of an FG-type. In the FG-type, the stacked gate includes the charge accumulation layer (floating gate: conductive layer) formed on the semiconductor substrate through the gate insulating film and the control gate formed on the floating gate through an intergate insulating film.

Note also that the memory cell array 1 need not be the above-described NAND-type, and instead may be a NOR-type. Further, the above-described embodiments may be implemented not only in a nonvolatile semiconductor memory apparatus but also in a semiconductor apparatus such as an LSI.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A nonvolatile semiconductor memory apparatus, comprising:

memory cell strings each including a plurality of memory cells including a charge accumulation layer and a control gate of which current pathways are connected in series;

first and second bit lines each connected to the current pathway of one of the memory cells in one end side of the series connection;

a first buffer connected to the first bit line and capable of holding first data of a first bit number;

a second buffer connected to the second bit line and capable of holding second data of the first bit number; and a data transfer controlling unit including first and second latches and controlling timing to output the first and second data held in the first and second buffers to an external terminal according to a first internal signal generated based on a first external signal, a second internal signal generated at rising of the first external signal and a third internal signal generated at falling of the first external signal, and the data transfer controlling unit transferring a control signal synchronized with the timing of the first and second data to the external terminal, the data transfer controlling unit allowing the first latch to hold the first and second data held in the first and second buffers respectively, in synchronization with the first internal signal, and transferring the first data held in the first latch in synchronization with the second internal signal to the external terminal through the second latch, and thereafter transferring the second data to the external terminal through the second latch in synchronization with the third internal signal.

2. The apparatus according to claim 1, wherein the first buffer includes a first selecting unit and a plurality of first buffer units capable of holding the first data, the second buffer includes a second selecting unit and a plurality of second buffer units capable of holding the second data, and the first selecting unit selects any one of the plurality of first buffer units and the second selecting unit selects any one of the plurality of second buffer units, thereby transferring the first and second data of the first bit number to the data transfer controlling unit.

3. The apparatus according to claim 2, wherein the first bit line and the second bit line include at least eight signal lines, the first and second buffer units are capable of holding the first and second data of at least 8 bits as the first bit number respectively, and the first and second selecting units transfer the first and second data of the at least 8 bits to the data transfer controlling unit through the first and second latches by selecting any one of the plurality of first and second buffer units respectively.

4. The apparatus according to claim 3, wherein the first and second data are serially output from the external terminal.

5. The apparatus according to claim 1, wherein
a fourth internal signal and a fifth internal signal are generated as the first internal signal according to the first external signal,
the first latch includes a third latch unit which is capable of holding the first data and to which the fourth internal signal is supplied, and includes a fourth latch unit which is capable of holding the second data and to which the fifth internal signal is supplied,
the data transfer controlling unit allows the third latch unit to hold the first data transferred from the first buffer in the first bit number in synchronization with the fourth internal signal, and thereafter allows the fourth latch unit to hold the second data transferred from the second buffer in synchronization with the fifth internal signal.

6. The apparatus according to claim 5, wherein
the second latch includes a first latch unit which is capable of holding the first data and to which the second internal signal is supplied, and includes a second latch unit which is capable of holding the second data and to which the third internal signal is supplied.

7. The apparatus according to claim 6, wherein
the first bit line and the second bit line include at least eight signal lines,
the first and second buffers are capable of holding the first and second data of at least 8 bits as the first bit number respectively, and
the data transfer controlling unit transfers the first and second data of the at least 8 bits to the external terminal through the first and second latches.

8. The apparatus according to claim 1, wherein
the second latch includes a first latch unit which is capable of holding the first data and to which the second internal signal is supplied, and includes a second latch unit which is capable of holding the second data and to which the third internal signal is supplied.

9. The apparatus according to claim 8, wherein
the first bit line and the second bit line include at least eight signal lines,
the first and second buffers are capable of holding the first and second data of at least 8 bits as the first bit number respectively, and
the data transfer controlling unit transfers the first and second data of the at least 8 bits to the external terminal through the first and second latches.

10. The apparatus according to claim 9, wherein the first and second data are serially output from the external terminal.

11. The apparatus according to claim 1, wherein
a fourth internal signal and a fifth internal signal are respectively generated as the first internal signal according to the first external signal, and
the data transfer controlling unit allows the first latch to hold the first data in accordance with the falling of the fourth internal signal and allows the first latch to hold the second data in accordance with the falling of the fifth internal signal.

12. The apparatus according to claim 11, wherein
the first latch includes a third latch unit which is capable of holding the first data and to which the fourth internal signal is supplied, and includes a fourth latch unit which is capable of holding the second data and to which the fifth internal signal is supplied, and
the data transfer controlling unit allows the third latch unit to hold the first data transferred from the first buffer in accordance with the falling of the fourth internal signal in the first bit number, and thereafter allows the fourth latch unit to hold the second data transferred from the second buffer in accordance with the falling of the fifth internal signal.

13. The apparatus according to claim 12, wherein
the second latch includes a fifth latch unit which is capable of holding the first data and to which the second internal signal is supplied, and includes a sixth latch unit which is capable of holding the second data and to which the third internal signal is supplied.

14. The apparatus according to claim 13, wherein
the first bit line and the second bit line include at least eight signal lines,
the first and second buffers are capable of holding the first and second data of at least 8 bits as the first bit number respectively, and
the data transfer controlling unit transfers the first and second data of the at least 8 bits to the external terminal through the first and second latches.

15. A nonvolatile semiconductor memory apparatus, comprising:
memory cell strings each including a plurality of memory cells including a charge accumulation layer and a control gate of which current pathways are connected in series;
first and second bit lines each connected to the current pathway of one of the memory cells in one end side of the series connection;
a first buffer connected to the first bit line and is capable of holding first data of a first bit number;
a second buffer connected to the second bit line and is capable of holding second data of the first bit number; and
a data transfer controlling unit including first and second latches and controlling timing to write the first and second data held in the first and second buffers into the memory cells according to a first internal signal generated based on a first external signal, a second internal signal generated at rising of the first external signal, and a third internal signal generated at falling of the first external signal, the first external signal being a signal synchronized with the first and second data transferred from an external terminal, and the data transfer controlling unit allowing the first latch to hold the first data input from the external terminal in synchronization with the second internal signal and the first latch to hold the second data input from the external terminal in synchronization with the third internal signal, and thereafter transferring the first and second data to the first and second buffers respectively, through the second latch in synchronization with the first internal signal.

16. The apparatus according to claim 15, wherein
the first buffer includes a first selecting unit and a plurality of first buffer units capable of holding the first data,
the second buffer includes a second selecting unit and a plurality of second buffer units capable of holding the second data, and
the first selecting unit selects any one of the plurality of first buffer units and the second selecting unit selects any one of the plurality of second buffer units, thereby transferring the first and second data of the first bit number transferred from the data transfer controlling unit to the first and second buffer units respectively.

17. The apparatus according to claim 16, wherein
the first bit line and the second bit line include at least eight signal lines,
the first and second buffer units are capable of holding the first and second data of at least 8 bits as the first bit number respectively, and
the first and second selecting units transfer the first and second data of the at least 8 bits to the data transfer controlling unit through the first and second latches by selecting any one of the plurality of first and second buffer units respectively.

18. The apparatus according to claim 15, wherein
a fourth internal signal and a fifth internal signal are generated as the first internal signal according to the first external signal,
the second latch includes a first latch unit which is capable of holding the first data and to which the fourth internal signal is supplied, and includes a second latch unit which is capable of holding the second data and to which the fifth internal signal is supplied, and
the data transfer controlling unit inputs the first data to the memory cell array in synchronization with the fourth internal signal through the second latch unit and the first buffer, and thereafter inputs the second data to the memory cell array in synchronization with the fifth internal signal through the second latch unit and the second buffer.

19. The apparatus according to claim 18, wherein
the first latch includes a first latch unit which is capable of holding the first data and to which the second internal signal is supplied, and includes a second latch unit which is capable of holding the second data and to which the third internal signal is supplied.

20. The apparatus according to claim 19, wherein
the first bit line and the second bit line include at least eight signal lines,
the first and second buffers are capable of holding the first and second data of at least 8 bits as the first bit number, and
the data transfer controlling unit transfers the first and second data of the at least the 8 bits to the memory cell string through the first and second latches.

* * * * *